United States Patent
Seyyedy

(10) Patent No.: US 6,292,417 B1
(45) Date of Patent: Sep. 18, 2001

(54) MEMORY DEVICE WITH REDUCED BIT LINE PRE-CHARGE VOLTAGE

(75) Inventor: Mirmajid Seyyedy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/626,211

(22) Filed: Jul. 26, 2000

(51) Int. Cl.$^7$ .................................................. G11C 7/00
(52) U.S. Cl. ........................ 365/203; 365/207; 365/205; 365/202
(58) Field of Search .................................. 365/203, 207, 365/205, 202, 204, 149

(56) References Cited

U.S. PATENT DOCUMENTS

| Re. 35,825 | 6/1998 | Zagar ........................ 365/226 |
|---|---|---|
| 4,598,389 | 7/1986 | Duvvury et al. ............ 365/208 |
| 4,625,300 | 11/1986 | McElroy ..................... 365/205 |
| 4,715,015 | 12/1987 | Mimoto et al. ............. 365/210 |
| 4,792,922 | 12/1988 | Mimoto et al. ............. 365/149 |
| 4,823,031 | 4/1989 | Kadakia ...................... 307/530 |
| 4,958,387 | 9/1990 | Fait et al. ......................... 4/236 |
| 4,980,862 | 12/1990 | Foss .............................. 365/203 |
| 5,013,943 | 5/1991 | Hirose ......................... 307/530 |
| 5,038,324 | 8/1991 | Oh ............................ 365/189.01 |
| 5,042,011 | 8/1991 | Casper et al. ............... 365/205 |
| 5,122,986 | 6/1992 | Lim et al. ................. 365/189.11 |
| 5,220,221 | 6/1993 | Casper ......................... 307/530 |
| 5,241,503 | 8/1993 | Cheng ......................... 365/205 |
| 5,295,100 | 3/1994 | Starkweather et al. .......... 365/189 |
| 5,303,196 | 4/1994 | Sang et al. .................. 365/206 |
| 5,309,392 | 5/1994 | Ootsuka et al. ............. 365/145 |
| 5,351,215 | 9/1994 | Tanabe ........................ 365/203 |
| 5,357,468 | 10/1994 | Satani et al. .............. 365/189.01 |
| 5,367,213 | 11/1994 | Casper et al. ................. 327/56 |
| 5,367,481 | 11/1994 | Takase et al. ............... 365/149 |
| 5,369,317 | 11/1994 | Casper et al. ................. 326/87 |
| 5,369,622 | 11/1994 | McLaury ..................... 365/233 |
| 5,402,378 | 3/1995 | Min et al. ................... 365/202 |
| 5,444,662 | 8/1995 | Tanaka et al. ............... 365/203 |
| 5,487,043 | 1/1996 | Furutani et al. ............. 365/203 |
| 5,506,811 | 4/1996 | McLaury ..................... 365/233 |
| 5,602,785 | 2/1997 | Casper et al. ............. 365/189.11 |
| 5,608,668 | 3/1997 | Zagar et al. ................ 365/149 |
| 5,614,856 | 3/1997 | Wilson et al. ............... 327/170 |
| 5,625,588 | 4/1997 | Seyyedy et al. ............. 365/149 |
| 5,636,170 | 6/1997 | Sayyedy ...................... 365/205 |
| 5,657,266 | 8/1997 | McLaury ..................... 365/149 |
| 5,677,878 | 10/1997 | Shirley et al. ............ 365/189.11 |

(List continued on next page.)

FOREIGN PATENT DOCUMENTS

| 59-139196 | 8/1984 | (JP) | .................. G11C/11/37 |
|---|---|---|---|
| 62184691 | 8/1987 | (JP) | .................. G11C/11/34 |
| 5-94962 | 4/1993 | (JP) | .................. G11C/11/401 |

OTHER PUBLICATIONS

Eto, S., et al., "A 1–Gb SDRAM with Ground–Level Precharged Bit Line and Nonboosted 2.1–V Word Line", *IEEE Journal of Solid–State Circuits*, 33(11), pp. 1697–1701, (1998).

Tsukude, M., et al., "TP: A 1.2V to 3.3V Wide–Voltage–Range DRAM with 0/8V Array Operation", *IEEE International Solid–State Circuits Conference*, pp. 46,47, 66, 67, (1997).

*Primary Examiner*—David Nelms
*Assistant Examiner*—David Lam
(74) *Attorney, Agent, or Firm*—Schwegman, Lundberg, Woessner & Kluth, P.A.

(57) ABSTRACT

A memory device and method use a low digit line pre-charge voltage. In one embodiment, a memory device uses sense amplifier nodes to provide a pre-charge supply voltage to the digit lines. By using a low pre-charge voltage, the memory device does not require boosted word line and isolation control voltages. P-sense amplifier circuitry of the memory device is activated prior to n-sense amplifier circuitry during sense operations.

22 Claims, 5 Drawing Sheets

U.S. PATENT DOCUMENTS

| | | | |
|---|---|---|---|
| 5,684,749 | 11/1997 | Seyyedy | 365/203 |
| 5,719,813 | 2/1998 | Seyyedy | 365/205 |
| 5,726,931 | 3/1998 | Zagar et al. | 365/149 |
| 5,754,478 | 5/1998 | Morgan et al. | 365/189.01 |
| 5,768,178 | 6/1998 | McLaury | 365/149 |
| 5,768,202 | 6/1998 | Raad | 365/207 |
| 5,796,666 | 8/1998 | Shirley et al. | 365/205 |
| 5,844,833 | 12/1998 | Zagar et al. | 365/149 |
| 5,856,939 | 1/1999 | Seyyedy | 365/149 |
| 5,866,928 | 2/1999 | Sick | 257/296 |
| 5,875,141 | 2/1999 | Shirley et al. | 365/207 |
| 5,889,718 * | 3/1999 | Kitamoto et al. | 365/210 |
| 5,894,444 | 4/1999 | Seyyedy | 365/205 |
| 5,905,686 | 5/1999 | Raad | 365/207 |
| 5,923,592 | 7/1999 | Morgan et al. | 365/189.01 |
| 5,940,339 | 8/1999 | Shirley et al. | 365/207 |
| 5,949,730 | 9/1999 | Shirley et al. | 365/207 |
| 6,066,870 | 5/2000 | Sick | 257/296 |
| 6,081,461 | 6/2000 | Shirley et al. | 365/190 |
| 6,122,211 | 9/2000 | Morgan et al. | 365/205 |
| 6,134,157 * | 10/2000 | Takeuchi | 365/200 |

* cited by examiner (PRIOR ART)

US 6,292,417 B1

MEMORY DEVICE WITH REDUCED BIT LINE PRE-CHARGE VOLTAGE

TECHNICAL FIELD OF THE INVENTION

The present invention relates generally to dynamic memory integrated circuits and in particular the present invention relates to bit line circuitry therein.

BACKGROUND OF THE INVENTION

Integrated circuit memories have become increasingly dense as the need for more memory storage increases. While fabrication techniques and design options have been fairly successful in maintaining steady increases in memory storage from design generation to generation, the need for new highly populated circuits continues.

A dynamic random access memory (DRAM) device is comprised of an arrangement of individual memory cells. Each memory cell comprises a capacitor capable of holding a charge and an access transistor for accessing the capacitor charge. The charge is referred to as a data bit and can be either a high voltage or a low voltage. Data can be either stored in the memory cells during a write mode, or data may be retrieved from the memory cells during a read mode. The data is transmitted on signal lines, referred to as bit or digit lines, which are coupled to input/output lines through transistors used as switching devices. For each bit of data stored, its true logic state is available on an I/O line and its complementary logic state is available at on an I/O compliment line. Thus, each memory cell has two digit lines, digit and digit complement.

Typically, the memory cells are arranged in an array and each cell has an address identifying its location in the array. The array comprises a configuration of intersecting rows and a memory cell is associated with each intersection. In order to read from or write to a cell, the particular cell in question must be selected, or addressed. The address for the selected cell is represented by input signals to a row decoder and to a column decoder. The row decoder activates a word line in response to the row address. The selected word line activates the access transistors for each of the memory cells in communication with the selected word line. The column decoder selects a digit line pair in response to the column address. For a read operation the selected word line activates the access transistors for a given row address, and data is latched to the digit line pairs.

Conventional dynamic memories use memory cells fabricated as capacitors in an integrated circuit to store data. That is, a logical "1" is stored as a charge on the capacitor and the capacitor is discharged for a logical "0". The pairs of digit lines are fabricated as metal lines on the integrated circuit and connected to the memory cells for transmitting data stored in the memory cells. The digit lines are typically pre-charged to an intermediate voltage level prior to reading a memory cell. Sense amplifiers are utilized to sense small differentials on the digit lines after a memory cell has been accessed and drive the digit lines to full power supply rails for either reading the memory cells or writing thereto.

Supply voltages for memory devices have been experiencing consistent reductions between memory device generations. This reduction in supply voltages creates problems with operating speeds. For example, sense amplifier speed can be reduced as the supply voltage reduces. Further, elevated word line and isolation device control signals are required at 1.8 volts supply levels.

For the reasons stated above, and for other reasons stated below which will become apparent to those skilled in the art upon reading and understanding the present specification, there is a need in the art for a memory device which can be operated at low supply voltages while maintaining comparable operating and data sensing speeds.

SUMMARY OF THE INVENTION

The above mentioned problems with memory devices and other problems are addressed by the present invention and which will be understood by reading and studying the following specification.

In particular, an illustrative embodiment of the present invention includes an integrated circuit memory comprising a plurality of memory cell capacitors, and a plurality of access devices connected to the plurality of memory cell capacitors and first and second digit lines. Each of the plurality of access devices selectively connects one of the plurality of memory cell capacitors to either the first or second the digit line. Sense amplifier circuitry is provided that has first and second sensing nodes each selectively connected to either the first or the second digit line. Control circuitry is coupled to the sense amplifier circuitry to provide a pre-charge voltage from the first and second sensing nodes to the first and second digit lines.

In another, a method is provided of operating a memory device comprising a pair of complimentary digit lines and sense amplifier circuitry. The method comprises equilibrating the pair of complimentary digit lines to a ground potential such that the pair of complimentary digit lines are discharged, pre-charging first and second sensing nodes of the sense amplifier circuitry to a pre-determined voltage level, and selectively coupling the first and second sensing nodes to the complimentary digit lines.

DETAILED DESCRIPTION OF THE INVENTION

In the following detailed description of the preferred embodiments, reference is made to the accompanying drawings which form a part hereof and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
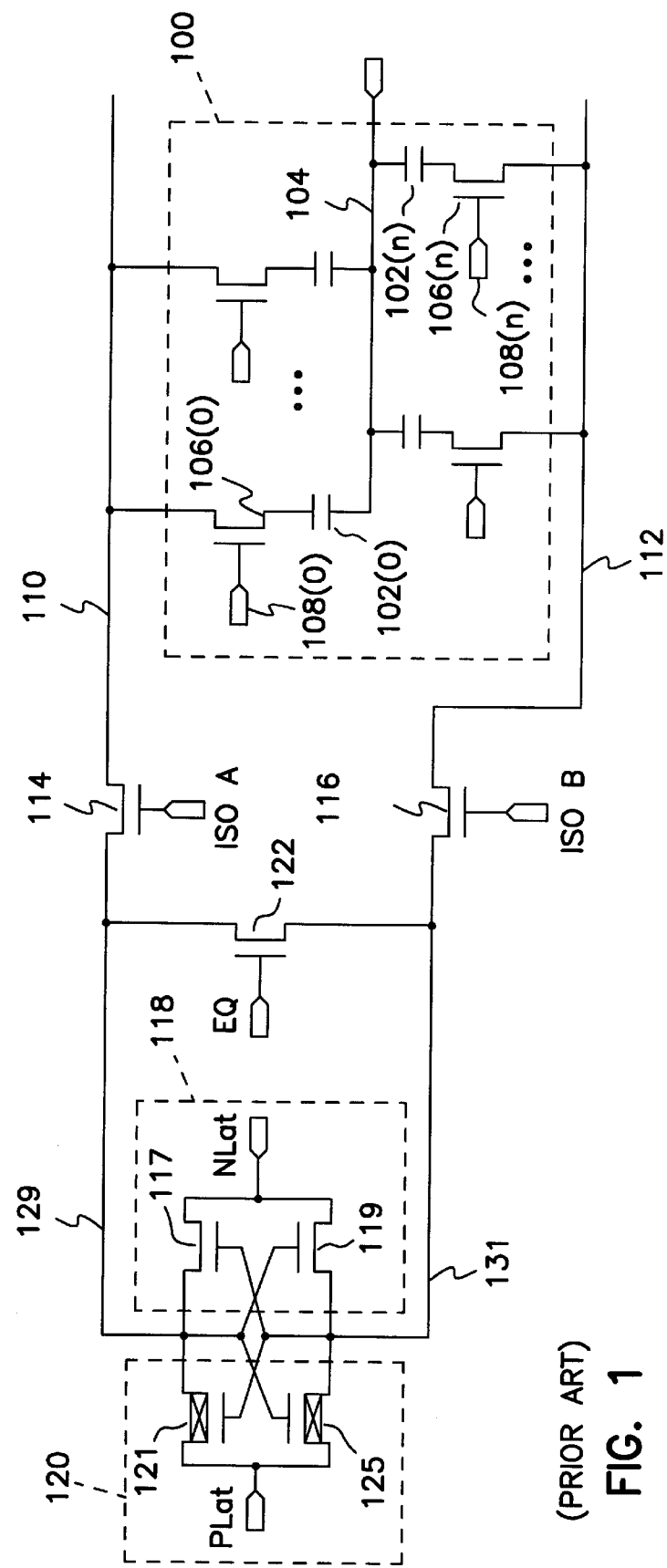
FIG. 1 illustrates a portion of a conventional dynamic memory access circuitry.

Referring to FIG. 1, a portion of a conventional dynamic memory access circuitry is described. See U.S. Pat. No. 5,684,749 entitled SINGLE-ENDED SENSING USING GLOBAL BIT LINES FOR DRAM, issued Apr. 29, 1997 for a description of a typical DRAM. A memory array 100 has a plurality of memory cells 102(0)–(n) which are fabricated as capacitors having one capacitive plate formed as a common cell plate 104 and the other node connected to an access transistor 106(0)–(n). Each access transistor is a n-type transistor having its gate connected to a word line 108(0)–(n). The cell plate 104 is typically biased to one-half the power supply voltage (Vcc) by a biasing source (not shown).

Digit lines 110 and 112 are each connected to some of the access transistors and memory cells. When access transistors 106 are selectively activated, the charge stored on the corresponding memory cell 102 is coupled to one of the digit lines. N-type isolation transistors 114 and 116 are used to isolate digit lines 110 and 112, respectively, from both the n-sense amp 118 and the p-sense amp 120. Equilibrate transistor 122 is used to equalize the nodes of the sense amps to the same voltage, as described below.

Figure 2:
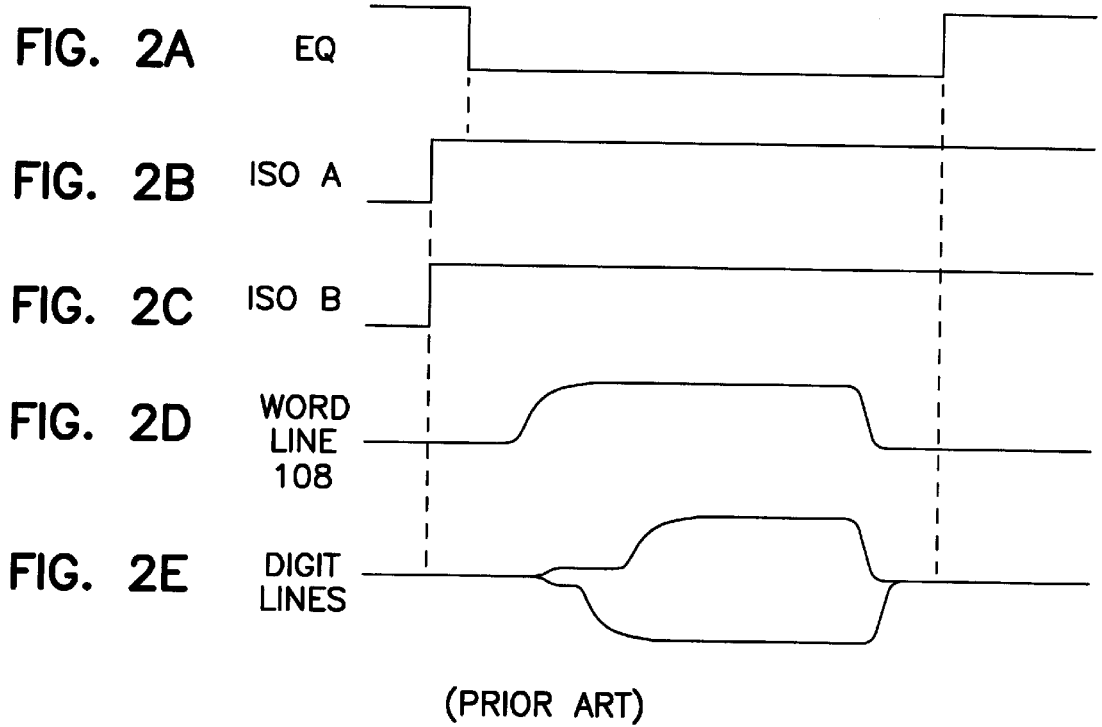
FIGS. 2A–2E illustrate a timing diagram of the circuit of FIG. 1.

In operation, data stored in the memory cells can be accessed and sensed following the process shown in FIG. 2. The first step is to equilibrate nodes 129 and 131 of sense amps 118 and 120 to Vcc/2, as sourced by a biasing circuit (not shown), by holding the gate of transistor 122 (EQ) high. The differential voltage across the sense amps is therefore zero with each node having a preferred voltage of one-half the supply voltage (Vcc). The next step is to activate isolation transistors 114 and 116 by providing their gates (ISO A and ISO B, respectively) with a high voltage. This connects the digit lines 110 and 112 to the sense amps 118 and 120 and allows the digit lines to also stabilize to Vcc/2. One of the memory cell access transistors 106(0)–(n) is then selectively activated by raising the associated word line 108(0)–(n) gate voltage. The charge, or lack of charge, stored on the selected memory cell 102 is then shared with one of the digit lines. If a logical "one" is stored on the capacitor the associated digit line will be slightly raised, for example by a voltage of approximately 100 mv. It will be understood that the charge shared with the digit line is directly dependant upon the charge stored on the memory cell. If the memory cell is un-charged the digit line voltage will drop, for example by 100 mv.

The n-sense amp 118 and the p-sense amp 120, as known to one skilled in the art, sense a differential between the digit lines and drive the digit lines to full rails in response. N-sense amp 118 has two n-channel transistors having their gates cross-coupled to the source of the other transistor. The drains of each transistor are connected together and controlled by an NLat line. The NLat line is typically pre-charged to the same level that nodes 129 and 131 have been equalized to, Vcc/2. The voltage on the NLat line is lowered to sense a high voltage on one of the nodes. Assuming for example that node 129 is 100 mv above node 131, transistor 119 will begin to turn on when the NLat drops by a threshold voltage below node 129. Node 131 will then be pulled to NLat to insure that transistor 117 does not turn on. Similarly, p-sense amp 120 has two cross-coupled p-channel transistors 121 and 125. The drains of each transistor are connected together and controlled by a PLat line. The PLat line is typically pre-charged to the same level that nodes 129 and 131 have been equalized to, Vcc/2. The voltage on the PLat line is raised to sense a low voltage on one of the nodes. Assuming for example that node 131 is 100 mv below node 129, transistor 121 will begin to turn on when the PLat increases by a threshold voltage above node 131. Node 129 will then be pulled to PLat to insure that transistor 125 does not turn on. The NLat and PLat are strobed to full power rails, ground and Vcc, respectively. If one of the digit lines is higher, therefore, that digit line will be driven to Vcc while the complementary digit line is pulled to ground.

As seen in FIG. 2, the voltage on the digit lines are equal until shortly after the word line is activated. The n-sense amp is strobed first to drive one line low and then the p-sense amp is strobed to drive the other line high. The digit lines remain latched at these full power levels until the equilibrate transistor 122 is again activated. During the time in which the word line is high and the digit lines are latched, the memory cell is refreshed.

By equilibrating the digit lines to ½ Vcc prior to accessing a memory cell, two problems are encountered when the memory device operates at a reduced supply voltage. The first problem is the need for a boosted voltage on both word lines and isolation control lines. This is due to the voltage difference between the pre-charged digit line voltage and the supply voltage. For example, the digit line pre-charge voltage (½ Vcc) of a memory device having a 1.8 volt supply (Vcc) is 0.9 volts. A typical n-channel transistor threshold voltage is a substantial portion of the 0.9 volt differential between the pre-charge voltage and Vcc. Thus, if a boosted word line voltage were not used, the charge shared from a memory cell storing a one would not be sufficient to create a voltage change on the associated digit line. A boosted word line. Therefore, is required to couple a full memory cell charge to its associated digit line when low supply voltages are used.

A second problem with low voltage DRAMs is the speed of the sense amplifier circuitry. As explained above, the sense amplifier circuitry comprises a p-sense circuit and an n-sense circuit. After a memory cell is accessed, the n-sense amplifier is traditionally activated first to pull the low digit line of the digit line pair to ground. In a low voltage memory device, the n-sense amplifier is slow to operate. For example, in a 1.8 volt supplied memory one digit line will be about 0.9 volts and the complimentary digit line will be about 1.1 volts. As such, one of the transistors will have a gate voltage of 1.1 volts and a source to drain voltage of 0.9 volts. This transistor will be relatively slow to activate. As such, low supply voltage memory devices can have difficulties performing fast memory read operations.

Figure 3:
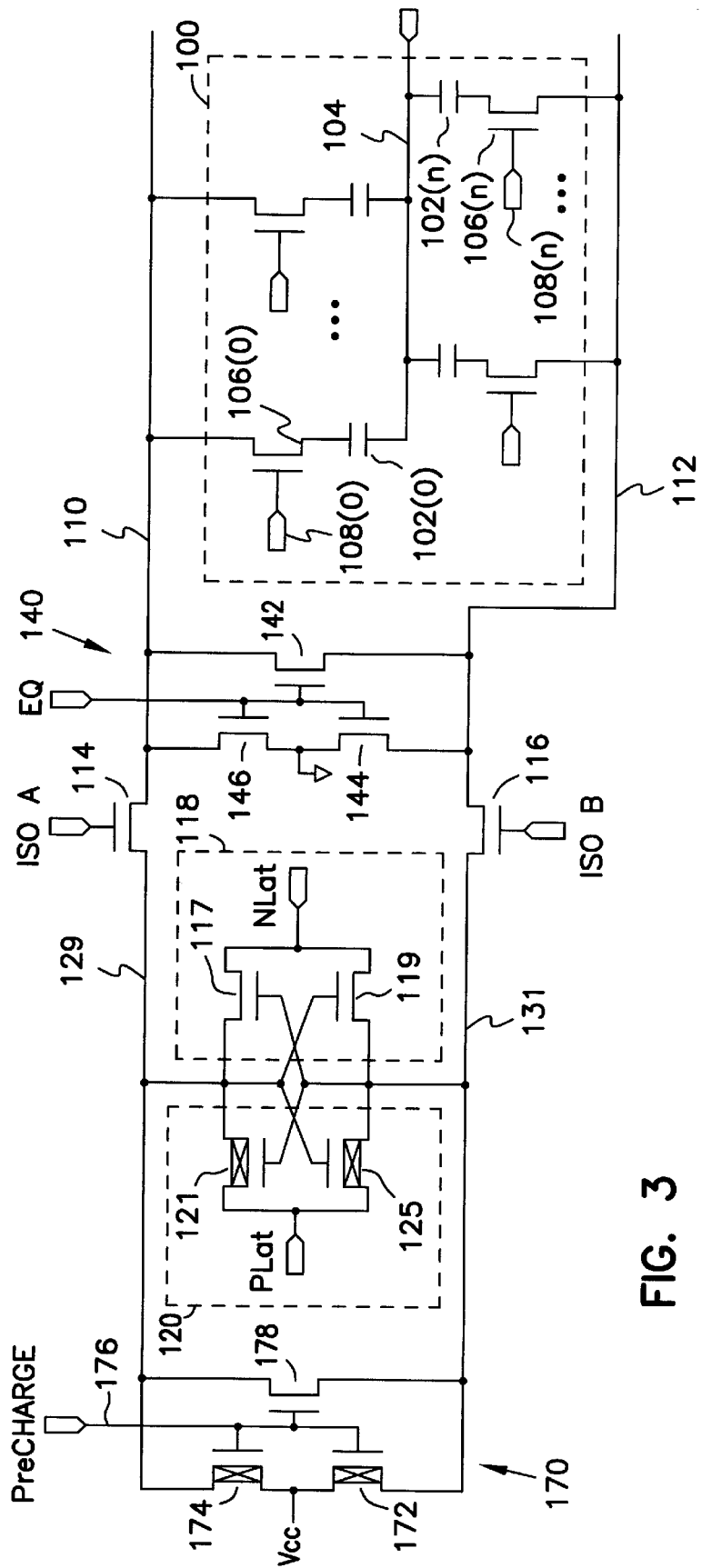
FIG. 3 illustrates a portion of a memory device of the present invention.

One embodiment of the present invention is illustrated in FIG. 3. A portion of a memory device is illustrated that equilibrates digit line pairs to a ground voltage prior to accessing a memory cell. The nodes of the sense amplifier are pre-charged to a predetermined voltage, for example Vcc. The charged sense amplifier nodes can be charge-shared with the digit lines to place a small charge on the digit lines, for example a 200 mv charge on each digit line. When a memory cell is coupled to a digit line, that digit line voltage will change to approximately 400–500 mv or 0.0 volts, if the memory cell contains a one or a zero, respectively. As such, the differential voltage between digit lines will be either 400–500 mv or the pre-charge level of about 200 mv.

P-sense amplifier circuitry 120 is activated prior to activating the n-sense amplifier circuitry 118. This operation provides a faster response to sensing the digit line differential voltage than activating the n-sense amplifier first. For example, when sensing a data one, one transistor of the p-sense amplifier circuit will have a gate voltage of 200 mv and a source-drain differential of about 1.3 (1.8–0.5). This differential will increase to 1.6 volts (1.8–0.2) for a logic zero stored on the memory cell. In either case, the p-sense amplifier transistor will respond faster than an n-sense amplifier transistor to couple a digit line to a respective power supply rail.

To perform the equilibration and pre-charge operations, an equilibrate circuit 140 is coupled to the digit lines 110 and 112 of memory array 110 and a pre-charge circuit 170 is coupled to the sense amplifier circuitry. The equilibrate circuitry 140 includes three n-channel transistors 142, 144 and 146. Transistors 144 and 146 couple the digit lines to ground during equilibrate operation (EQ at a logic one). The third transistor 142 is coupled between the two digit lines to provide a faster discharge of the high digit line. Other equilibrate circuitry can be used and the present invention is not limited to the embodiment illustrated. Any equilibrate circuit that couples the digit lines to ground can be provided.

The pre-charge circuitry 170, in one embodiment, includes two p-channel transistors 172 and 174 each coupled between a sense amplifier node 129 or 131 and a pre-charge voltage supply node 176. An optional transistor 178 can be coupled between the two sense amplifier nodes. In this embodiment, the pre-charge voltage is Vcc, but can be any pre-determined voltage. That is, the sense amplifier nodes have some capacitance and the voltage level at which these nodes are pre-charged will define the resultant digit line voltage level. The capacitance ration of the sense amplifier nodes to the digit lines is also a factor that influences the digit line pre-charge levels. Further, the sense amplifier nodes can be augmented by coupling additional capacitance. The capacitance can be parasitic capacitance or even a dummy memory cell. In either case, it is important that the sense amplifier node capacitances be balanced. Other pre-charge circuitry can be used and the present invention is not limited to the embodiment illustrated. Any pre-charge circuit that couples the sense amplifier nodes to a pre-charge voltage can be provided.

Figure 4:
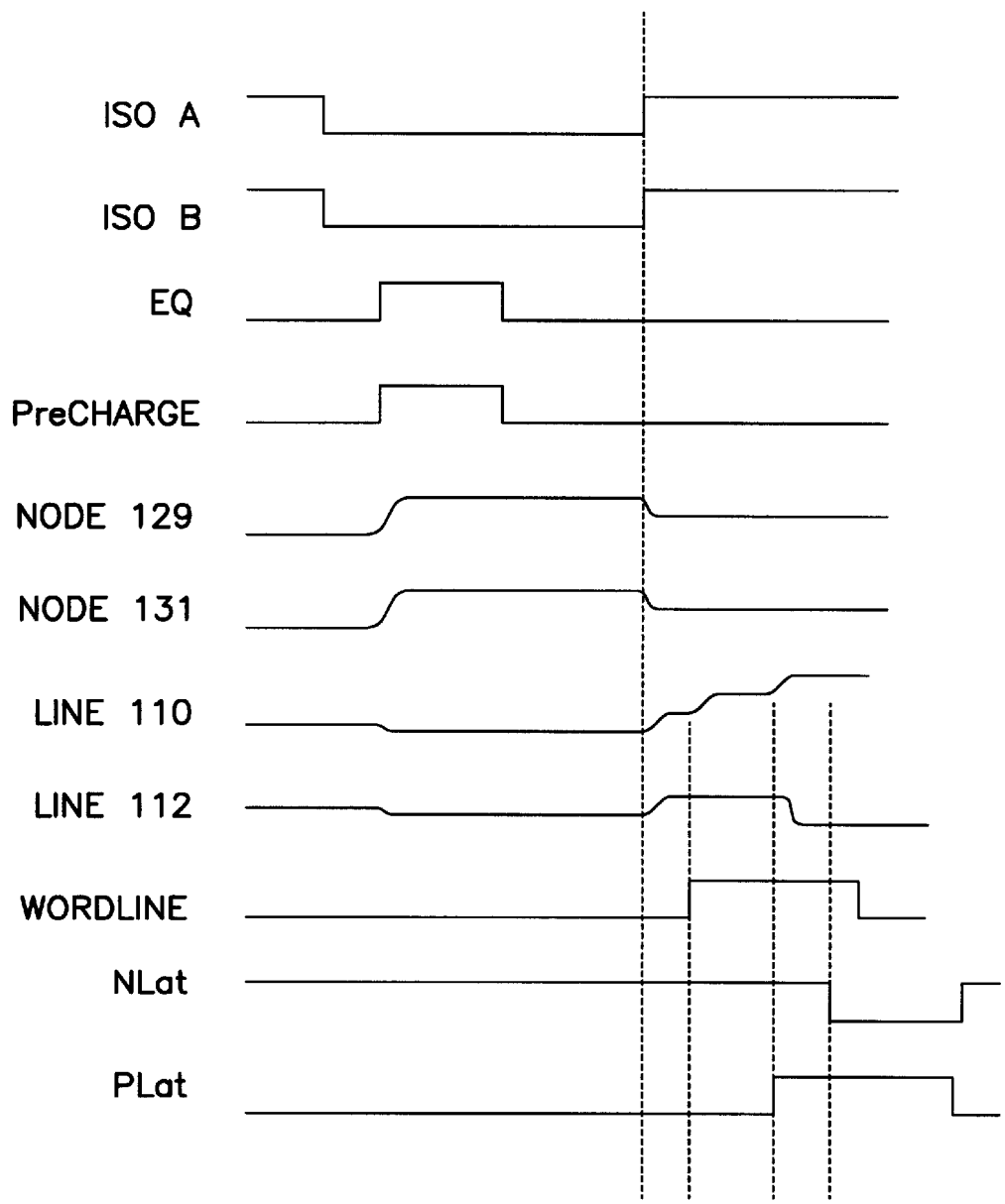
FIG. 4 is a timing diagram of the circuit of FIG. 3.

FIG. 4 illustrates a timing diagram of the circuit of FIG. 3. Prior to equilibrating the digit lines, the isolation transistors are turned off to separate the digit lines from the sense amplifier nodes. The digit lines are then equilibrated to ground. At about the same time the sense amplifier nodes are charged to the pre-charge voltage via the activated pre-charge circuit and Pre-charge signal. The equilibrate control signal is returned to a low level to deactivate the equilibrate circuit. The isolation circuitry is then activated to couple the sense amplifier nodes to the digit lines. The charge stored on the sense amplifier nodes is shared with the digit lines to provide a low level charge on the digit lines. The low level charge provides a bite line voltage of approximately 200 mv. After the digit lines are pre-charged using the sense amplifier nodes, a word line signal is raises to activate an access transistor and couple a memory cell to its corresponding digit line. The memory cell will either discharge the digit line or raise the digit line charge (line 110 is increased in this example). This is dependant upon the data stored on the memory cell.

After the memory cell is coupled to the digit line, the p-sense amplifier is activated to pull the low digit line to ground. The n-sense amplifier is then activated to pull the high digit line to Vcc. The word line can remain high during the sense amplifier activation to restore the data stored on the memory cell.

It will be appreciated by those skilled in the art, with the benefit of the present disclosure, that the word line and isolation devices do not need to be activated with a control signals that have a voltage level that is greater than Vcc. Further, the present low voltage memory device can perform sense operations faster than a low voltage memory device that uses the convention n-sense amplifier first activation technique.

Figure 5:
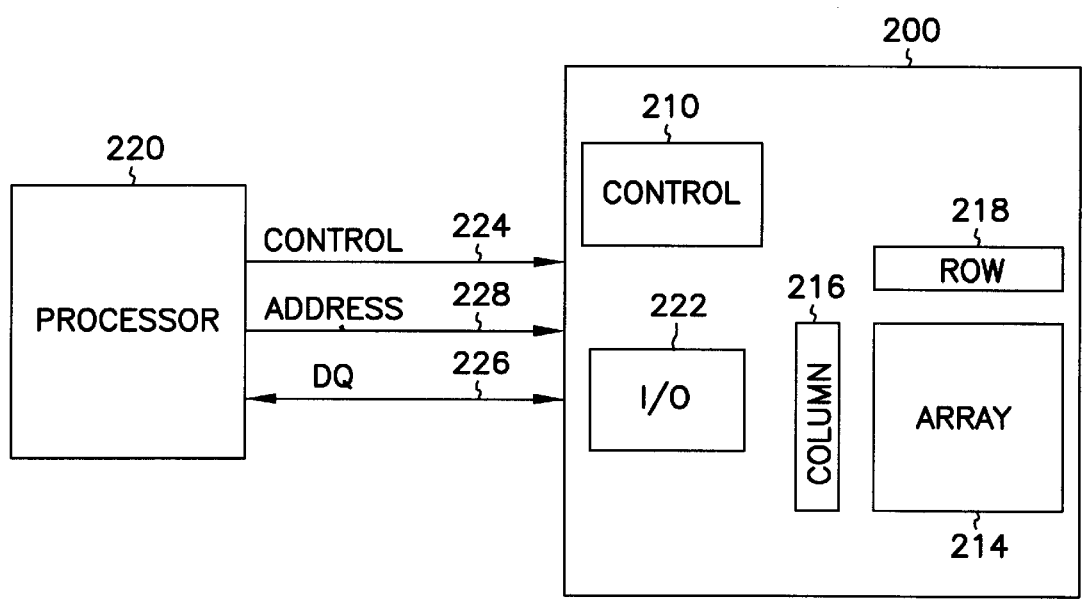
FIG. 5 is one embodiment of a memory device of the present invention.

FIG. 5 illustrates an integrated circuit memory device including the equilibrate and pre-charge circuitry. The device can be a memory circuit 200 such as a dynamic random access memory (DRAM) which is coupled to a processor 220. The memory device can be coupled to a processor 220 such as a microprocessor of a personal computer. The memory device 200 includes a memory array 214 having rows and columns of memory cells. Column decoder 216 and row decoder 218 are provided to access the memory array in response to address signals provided by the processor 220 on address communication lines 228. Data communication is conducted via I/O buffer circuitry 222 and bi-directional data communication lines 226 (DQ). Internal control circuitry 210 accesses the memory array in response to commands provided by the processor 220 on control lines 224. The array includes pre-charge and equilibrate circuitry described in detail above. It will be appreciated by those skilled in the art that the present invention is equally applicable to other types of dynamic memory devices.

CONCLUSION

A memory device and method have been described which use a low digit line pre-charge to provide a low supply voltage memory. In particular, the description provides a memory device which uses sense amplifier nodes to provide a pre-charge supply to the digit lines. By using the low pre-charge voltage, the memory device does not require boosted word line and isolation control voltages. Further, the p-sense amplifier circuitry is activated prior to n-sense amplifier circuitry to increase the sensing speed of the low voltage memory device.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention.

What is claimed is:

1. An integrated circuit memory, comprising:

a plurality of memory cell capacitors;

a plurality of access devices connected to the plurality of memory cell capacitors and first and second digit lines, each of the plurality of access devices for selectively connecting one of the plurality of memory cell capacitors to either the first or the second digit line;

sense amplifier circuitry having first and second sensing nodes each selectively connected to either the first or the second digit line;

control circuitry coupled to the sense amplifier circuitry to provide a pre-charge voltage from the first and second sensing nodes to the first and second digit lines; and an equilibrate circuit for equilibrating the first and second digit lines to a ground potential.

2. The integrated circuit memory of claim 1 further comprising:

isolation circuitry electrically located between the first and second sensing nodes of the sense amplifier circuitry and the first and second digit lines.

3. The integrated circuit memory of claim 1 wherein the equilibrate circuit comprises first and second transistors, the first transistor is coupled between the first digit line and a ground potential connection, and the second transistor is coupled between the second digit line and the ground potential connection.

4. An integrated circuit memory comprising:

a plurality of memory cell capacitors;

a plurality of access devices connected to the plurality of memory cell capacitors and first and second digit lines, each of the plurality of access devices for selectively connecting one of the plurality of memory cell capacitors to either the first or the second digit line;

sense amplifier circuitry having first and second sensing nodes each selectively connected to either the first or the second digit line;

control circuitry coupled to the sense amplifier circuitry to provide a pre-charge voltage from the first and second sensing nodes to the first and second digit lines; and wherein the sense amplifier circuitry comprises a pre-charge circuit coupled to the first and second sensing nodes for charging the first and second sensing nodes to a predetermined voltage potential.

5. The integrated circuit memory of claim 4 wherein the pre-charge circuitry comprises first and second transistors, the first transistor is coupled between the first sensing node and a voltage supply connection, and the second transistor is coupled between the second sensing node and the voltage supply connection.

6. An integrated circuit memory comprising:

a plurality of memory cell capacitors;

a plurality of access devices connected to the plurality of memory cell capacitors and first and second digit lines, each of the plurality of access devices for selectively connecting one of the plurality of memory cell capacitors to either the first or the second digit line;

sense amplifier circuitry having first and second sensing nodes each selectively connected to either the first or the second digit line;

control circuitry coupled to the sense amplifier circuitry to provide a pre-charge voltage from the first and second sensing nodes to the first and second digit lines;

isolation circuitry electrically located between the first and second sensing nodes of the sense amplifier circuitry and the first and second digit lines;

an equilibrate circuit for equilibrating the first and second digit lines to a ground potential; and wherein the sense amplifier circuitry comprises a pre-charge circuit coupled to the first and second sensing nodes for charging the first and second sensing nodes to a predetermined voltage potential.

7. A dynamic memory comprising:

a plurality of memory cell capacitors;

a plurality of access devices connected to the plurality of memory cell capacitors and first and second digit lines, each of the plurality of access devices for selectively connecting one of the plurality of memory cell capacitors to either the first or the second digit line;

an equilibrate circuit for equilibrating the first and second digit lines to a ground potential;

a sense amplifier having first and second nodes;

a pre-charge circuit coupled to the first and second sensing nodes for charging the first and second sensing nodes to a predetermined voltage potential;

a first isolation transistor electrically located between the first node of the sense amplifier and the first digit line for selectively isolating the first node from the first digit line; and a second isolation transistor electrically located between the second node of the sense amplifier and the second digit line for selectively isolating the second node from the second digit line.

8. The dynamic memory of claim 7 further comprising control circuitry for activating the equilibrate circuit for equilibrating the first and second digit lines to the ground potential, activating the pre-charge circuit for charging the first and second sensing nodes to the predetermined voltage potential, and activating the first and second isolation transistors after the equilibrate circuit and pre-charge circuit have been activated.

9. The dynamic memory of claim 8 wherein the control circuitry deactivates the equilibrate circuit and the pre-charge circuit prior to activating the first and second isolation transistors.

10. The dynamic memory of claim 8 wherein the sense amplifier comprises a p-sense amplifier circuit having p-channel transistors and an n-sense amplifier circuit having n-channel transistors, the p-sense amplifier and the n-sense amplifier are coupled to the first and second sensing nodes.

11. The dynamic memory of claim 10 wherein the control circuitry activates the p-sense amplifier circuit prior to activating the n-sense amplifier circuit during a sensing operation.

12. A method of operating a memory device comprising a pair of complimentary digit lines and sense amplifier circuitry, the method comprising:

equilibrating the pair of complimentary digit lines to a ground potential such that the pair of complimentary digit lines are discharged;

pre-charging first and second sensing nodes of the sense amplifier circuitry to a pre-determined voltage level; and selectively coupling the first and second sensing nodes to the complimentary digit lines.

13. The method of claim 12 further comprising:

selectively coupling a memory cell to one of the complimentary digit lines;

activating a p-sense amplifier circuit of the sense amplifier circuitry; and activating an n-sense amplifier circuit of the sense amplifier circuitry.

14. The method of claim 12 wherein selectively coupling the first and second sensing nodes is performed after equilibrating the pair of complimentary digit lines and pre-charging first and second sensing nodes.

15. The method of claim 12 wherein the pre-determined voltage level is selected so that a resultant charge produced on the complimentary digit lines as a result of charge sharing from the first and second sensing nodes to the complimentary digit lines is approximately 0.2 volts.

16. The method of claim 15 further comprising:

selectively coupling a memory cell to one of the complimentary digit lines;

activating a p-sense amplifier circuit of the sense amplifier circuitry; and activating an n-sense amplifier circuit of the sense amplifier circuitry.

17. An integrated circuit memory system comprising:

a processor; and a memory device coupled to the processor, the memory device comprising, a plurality of memory cell capacitors;

a plurality of access devices connected to the plurality of memory cell capacitors and first and second digit lines, each of the plurality of access devices for selectively connecting one of the plurality of memory cell capacitors to either the first or the second digit line;

an equilibrate circuit for equilibrating the first and second digit lines to a ground potential;

a sense amplifier having first and second nodes;

a pre-charge circuit coupled to the first and second sensing nodes for charging the first and second sensing nodes to a predetermined voltage potential; and control circuitry coupled to the sense amplifier circuitry to provide a pre-charge voltage from the first and second sensing nodes to the first and second digit lines.

18. The integrated circuit memory system of claim 17 wherein the memory device further comprises:

a first isolation transistor electrically located between the first node of the sense amplifier and the first digit line for selectively isolating the first node from the first digit line; and a second isolation transistor electrically located between the second node of the sense amplifier and the second digit line for selectively isolating the second node from the second digit line.

19. The integrated circuit memory system of claim 18 wherein the control circuitry for activates the equilibrate circuit to equilibrate the first and second digit lines to the ground potential, activates the pre-charge circuit to charge the first and second sensing nodes to the predetermined voltage potential, and activates the first and second isolation transistors after the equilibrate circuit and pre-charge circuit have been activated.

20. The integrated circuit memory system of claim 19 wherein the control circuitry deactivates the equilibrate circuit and the pre-charge circuit prior to activating the first and second isolation transistors.

21. The integrated circuit memory system of claim 17 the sense amplifier comprises a p-sense amplifier circuit having p-channel transistors and an n-sense amplifier circuit having n-channel transistors, the p-sense amplifier and the n-sense amplifier are coupled to the first and second sensing nodes.

22. The integrated circuit memory system of claim 21 wherein the control circuitry activates the p-sense amplifier circuit prior to activating the n-sense amplifier circuit during a sensing operation.

* * * * *

UNITED STATES PATENT AND TRADEMARK OFFICE
CERTIFICATE OF CORRECTION

PATENT NO.     : 6,292,417 B1  
DATED          : September 18, 2001  
INVENTOR(S)    : Mirmajid Seyyedy Page 1 of 1

It is certified that error appears in the above-identified patent and that said Letters Patent is hereby corrected as shown below:

Column 4,  
Line 19, delete "a" between "storing" and "one".  
Lines 21-22, delete "A boosted word line."

Column 9, claim 19,  
Line 21, delete "for" after "circuitry".

Column 10, claim 21,  
Line 11, insert -- wherein -- between "17" and "the sense".

Signed and Sealed this

Ninth Day of April, 2002

Attest:

JAMES E. ROGAN  
*Director of the United States Patent and Trademark Office*

*Attesting Officer*